United States Patent
Utsumi et al.

(10) Patent No.: US 8,936,998 B2
(45) Date of Patent: Jan. 20, 2015

(54) MANUFCATURING METHOD FOR ROOM-TEMPERATURE SUBSTRATE BONDING

(71) Applicants: Jun Utsumi, Kanagawa (JP); Takayuki Goto, Kanagawa (JP); Kensuke Ide, Shiga (JP); Hideki Takagi, Ibaraki (JP); Masahiro Funayama, Kanagawa (JP)

(72) Inventors: Jun Utsumi, Kanagawa (JP); Takayuki Goto, Kanagawa (JP); Kensuke Ide, Shiga (JP); Hideki Takagi, Ibaraki (JP); Masahiro Funayama, Kanagawa (JP)

(73) Assignees: Mitsubishi Heavy Industries, Ltd., Tokyo (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 13/797,521

(22) Filed: Mar. 12, 2013

(65) Prior Publication Data

US 2013/0213561 A1    Aug. 22, 2013

Related U.S. Application Data

(62) Division of application No. 12/741,916, filed as application No. PCT/JP2008/068544 on Oct. 14, 2008, now abandoned.

(30) Foreign Application Priority Data

Nov. 8, 2007  (JP) ................. 2007-290922

(51) Int. Cl.
*H01L 21/30*  (2006.01)
*H01L 21/302*  (2006.01)
(Continued)

(52) U.S. Cl.
CPC ............ *H01L 21/2007* (2013.01); *H01L 24/28* (2013.01); *H01L 24/31* (2013.01);
(Continued)

(58) Field of Classification Search
CPC .............. B81C 2203/0109; B81C 2203/0118; B81C 2201/019; H01L 21/2007; H01L 24/83
USPC ............ 438/455, 456; 257/E23.009, E23.192
See application file for complete search history.

(56) References Cited

U.S. PATENT DOCUMENTS 6,054,363 A    4/2000  Sakaguchi et al.
6,639,249 B2   10/2003  Valliath
(Continued)

FOREIGN PATENT DOCUMENTS

JP    63-101085 A    5/1988
JP    6-166550 A     6/1994
(Continued)

OTHER PUBLICATIONS

Gary S. May, Fundamantals of Semiconductor Fabrication,2004, John Wiley and Sons, pp. 41-45.*

(Continued)

*Primary Examiner* — Jerome Jackson, Jr.
*Assistant Examiner* — Paul Budd
(74) *Attorney, Agent, or Firm* — Birch, Stewart, Kolasch & Birch, LLP

(57) ABSTRACT

A device is provided with: a first substrate mainly containing silicon dioxide; a second substrate mainly containing silicon, compound semiconductor, silicon dioxide or fluoride; and a bonding functional intermediate layer arranged between the first substrate and the second substrate. The first substrate is bonded to the second substrate thorough room temperature bonding in which a sputtered first surface of the first substrate is contacted with a sputtered second surface of the second substrate via the bonding functional intermediate layer. Here, the material of the bonding functional intermediate layer is selected from among optically transparent materials which are oxide, fluoride, or nitride, the materials being different from the main component of the first substrate and different from the main component of the second substrate.

10 Claims, 6 Drawing Sheets

(51) Int. Cl.
*H01L 21/324* (2006.01)
*H01L 21/20* (2006.01)
*H01L 23/00* (2006.01)
*H01L 31/0203* (2014.01)

(52) U.S. Cl.
CPC ............... *H01L 24/83* (2013.01); *H01L 24/75* (2013.01); *H01L 31/0203* (2013.01); *H01L 2224/83099* (2013.01); *H01L 2224/8385* (2013.01); *H01L 2224/83894* (2013.01); *H01L 2924/01012* (2013.01); *H01L 2924/01013* (2013.01); *H01L 2924/01015* (2013.01); *H01L 2924/01018* (2013.01); *H01L 2924/0102* (2013.01); *H01L 2924/01033* (2013.01); *H01L 2924/0104* (2013.01); *H01L 2924/0105* (2013.01); *H01L 2924/01051* (2013.01); *H01L 2924/01082* (2013.01); *H01L 2924/04941* (2013.01); *H01L 2924/07802* (2013.01); *H01L 2924/01006* (2013.01); *H01L 2924/01072* (2013.01); *H01L 2924/014* (2013.01)
USPC ............ 438/455; 257/E21.088; 257/E21.122; 438/456

(56) References Cited

U.S. PATENT DOCUMENTS

| | | | |
|---|---|---|---|
| 7,101,735 | B2 | 9/2006 | Noma et al. |
| 2004/0226162 | A1 | 11/2004 | Miura et al. |
| 2004/0235266 | A1* | 11/2004 | Tong .............................. 438/455 |
| 2006/0286388 | A1 | 12/2006 | Wei et al. |
| 2008/0179547 | A1* | 7/2008 | Henley ..................... 250/492.21 |

FOREIGN PATENT DOCUMENTS

| | | | |
|---|---|---|---|
| JP | 10-200079 | A | 7/1998 |
| JP | 2000-56265 | A | 2/2000 |
| JP | 2004-54170 | A | 2/2004 |
| JP | 2004-337927 | A | 12/2004 |
| JP | 2004-343359 | A | 12/2004 |
| JP | 2005-70682 | A | 3/2005 |
| JP | 2005-104810 | A | 4/2005 |
| JP | 2007-42750 | A | 2/2007 |

OTHER PUBLICATIONS

Stanely Wolf, Silicon Processing for the VLSI ERA, 2000, Lattice Press, vol. 1, pp. 265-268.*
M.M.R Howlader et al., Room temperature wafer level glass/glass bonding, Dec. 19, 2005,Sensors and Actuators A 127 (2006), pp. 31-36.*
C. Tudryn, "Characterization of Anodic Bonding", The Catholic University of America, 2000, pp. 3, 83-118.
George Wallis, "Field Assisted Glass Sealing" Electrocomponent Science and Technology 1975, vol. 2, No. 1, pp. 45-53.
H. Takagi, et al. "Low-Temperature Direct Bonding of Silicon and Silicon Dioxide by the Surface Activation Method", Sensors and Actuators A 70 (1998) pp. 164-170.
Hideki Takagi, "Room-Temperature Bonding of Silicon Wafers by means of the Surface Activation Method", Report of Mechanical Engineering Laboratory No. 189 (2000).
Howlader, et al. "Room Temperature Wafer Level Glass/Glass Bonding" Sensors and Actuators A 127 (2006) pp. 31-36.
Howlader, et al. "Sequential Plasma Activation Process for Microfluidics Packaging at Room Temperature" 2005 Electronic Components and Technology Conference, pp. 611-616.
Kondou, et al. "Si Nanoadhesion Layer for Enhanced SiO2—SiN Wafer Bonding" Scripta Materialia 65 (2011) pp. 320-322.
Satoru Suehara et al., "Low Temperature Glass Wafer Bonding with Sequential Plasma Activation", The Transactions of the Institute of Electronics, Information and Communication Engineers. C, Nov. 1, 2005, vol. J88-C, No. 11, pp. 920 to 927.
Takagi et al., "Corrosion resistant and highly reliable integration technology for MEMS devices", Proceedings of NEDO (New Energy and Industrial Technology Development Organization), 2003 Research Promotion Business Accomplishment Report Meeting, pp. 220-225, 2003.
Xing, et al "TEM Study of the Interface of Anodic-bonded Si/glass", Scripta Materialia 47 (2002), pp. 577-582.

* cited by examiner

BEAM IRRADIATION

MANUFCATURING METHOD FOR ROOM-TEMPERATURE SUBSTRATE BONDING

This application is a Divisional of co-pending U.S. patent application Ser. No. 12/741,916 filed on Jul. 13, 2010 which is a National Phase of PCT/JP2008/068544 filed on Oct. 14, 2008, which claims priority under 35 U.S.C. §119 (a) to Patent Application JP 2007-290922 filed in Japan on Nov. 8, 2007, all of which are hereby expressly incorporated by reference in their entirety.

TECHNICAL FIELD

The present invention relates to a device and a device manufacture method, particularly to a device using light and a method of manufacturing the device.

BACKGROUND ART

Photo detectors such as optical sensors, light-emitting devices such as LEDs, and optical signal transmission devices such as optical switches are used as light-based devices (so-called optical devices), in every field of industries. Among these, applications of solid-state imaging devices such as CCDs and CMOS image sensors manufactured by applying a semiconductor microfabrication technique have been increasingly enhanced. Furthermore, development and application of optical MEMS devices having functions of these optical devices incorporated in a micro machine element are rapidly underway. To optical MEMS devices of this type, not only a Si substrate for which a microfabrication technique has been established but also materials having high light transmission, particularly $SiO_2$ materials (such as synthetic quartz and glass) are often applied.

In manufacturing a solid-state imaging device or an optical MEMS device of this type, a wafer level process is generally used in which a plurality of devices are collectively formed on a semiconductor wafer and sealed, and the semiconductor wafer is divided into individual devices by dicing.

The wafer level packaging is a technique which involves layering and bonding a sealing wafer onto a device wafer on which the devices are formed, to seal the devices in this manufacturing process. In recent years, a manufacture method using direct bonding for bonding the wafers is proposed. Since no other material layers are present on the interface between the wafers in the bonding based on the direct bonding without using adhesive or solder, it is advantageously possible to ensure high bonding strength and favorable interface physical properties. Examples of direct bonding conventionally used to manufacture an MEMS device include anodic bonding and diffusion bonding. Furthermore, there is recently proposed a bonding method for obtaining strong bonding with hydrogen bondings and heat treatment through preparing hydroxy groups or the like on a flattened and cleaned surface.

These direct bonding methods are, however, accompanied by heat treatment in the bonding step or after bonding, and this causes a problem in the manufacture of the MEMS devices. For the optical MEMS device, optical transparency is required for packaging, and therefore sealing is desired which uses an optically transparent substrate (such as $SiO_2$ base material), which is different from the device substrate (such as Si). When the bonding step of such different substrates are accompanied by heat treatment, a heat strain is generated on the bonding interface due to the difference in the thermal expansion coefficient between the substrate materials, which deteriorates reliability and durability of the devices. Therefore, reduction of the bonding process temperature is a major technical problem with the manufacture of MEMS devices. It is another manufacture problem that the tact time of the manufacture cannot be shortened since it takes time for heating and cooling.

Therefore, it is desired to apply a room-temperature bonding process that is not accompanied by heating in the bonding step; however, the bonding performance largely depends on the physical properties of the material to be bonded in the room-temperature bonding, particularly that achieving bonding with dangling bonds of the surfaces to be bonded without applying active groups to the surfaces. Especially, it is known to be difficult to bond the $SiO_2$ base material to a target substrate by the room-temperature bonding.

While the room-temperature bonding has been known as a metal bonding method, the room-temperature bonding is has been gradually applied to bonding of semiconductor material or oxide material. However, as described in Takagi et al., Proceedings of NEDO (New Energy and Industrial Technology Development Organization), 2003 Research Promotion Business Accomplishment Report Meeting, pp. 220-225 (2003), it is known that considerable bonding strength can be obtained for some of oxide materials such as $Al_2O_3$ through surface activation and pressure application, while practical bonding strengths cannot be obtained for materials such $SiO_2$. Accordingly, there is proposed a method using a surface treatment and a treatment after heating such as application of active groups onto the surfaces to be bonded.

Japanese Laid Open Patent Application No. P2004-054170A discloses a method of bonding laser optical crystals. This method is characterized by bonding the laser optical crystals by performing only ion beam etching on the bonding surfaces without using any intermediate material such as adhesive. This method is a technique developed as a method of bonding laser optical crystals, particularly $YVO_4$ crystals. Although this method is applicable to bonding of a garnet crystal, this method cannot bond $SiO_2$ base material.

Japanese Laid Open Patent Application No. P2005-104810A discloses a method of performing room-temperature bonding for a functional ceramics polycrystal to a semiconductor single crystal such as Si. This method is characterized by involving forming a metal thin layer having reaction activity to semiconductor on the surface of the ceramics polycrystal, and bonding the ceramics polycrystal to the semiconductor single crystal with the reaction product generated by a reaction of metal to semiconductor. This method is proposed as an effective technique for bonding a ceramics substrate having a high surface roughness.

However, these methods suffers from a problem that a heating treatment is required as a step after the bonding when the methods are applied to the MEMS device manufacture. Furthermore, target materials are limited because of the premise of reactivity between the bonding target substrate and the metal layer.

On the other hand, Takagi, Mechanical Engineering Laboratory Report 189 (2000) or the like has pointed out that even a hard-to-bond material such as $SiO_2$, for which strength cannot be obtained only with surface activation and pressure application, can be room-temperature-bonded by forming a metal film on the surfaces to be bonded. Methods of specifically executing this have been proposed so far.

Japanese Laid Open Patent Application No. P2004-337927A discloses a technique characterized by forming a metal thin film on a to-be-bonded surface as a method of bonding ionic crystal substrates that are hard to bond by room-temperature bonding. With this technique, an inert gas ion beam or inert gas neutral atom beam and a metal ion beam or metal neutral atom beam are irradiated onto the to-be-bonded surfaces in vacuum to form a metal thin film having a thickness of 1 nm to 100 nm on the to-be-bonded surface of each substrate.

Japanese Laid Open Patent Application No. P2004-343359A discloses a method of manufacturing an elastic surface wave device by room-temperature bonding and refers to a bonding method with an intermediate film as a method therefor. The method is characterized by bonding a piezoelectric single crystal substrate made of $LiTaO_3$ or the like to a crystalline substrate made of $Al_2O_3$, Si or the like by a surface activation treatment and pressure application without a heat treatment at high temperature. As one example of this method, a method of bonding the both substrates by forming Si or insulating material or a metal layer as the intermediate layer.

DISCLOSURE OF INVENTION

As stated above, it is difficult to bond $SiO_2$ base material with a practical bonding strength only by the surface activation and pressure application. It is effective to provide metal or the like on the bonding interface as the bonding functional intermediate layer which causes bonding strength so as to obtain the practical bonding strength.

However, the method using the metal as the bonding functional intermediate layer is a technique which is only directed to the occurrence of the bonding strength and cannot sufficiently provide other bonding interface physical properties such as optical transparency. Even a very thin metal layer (100 nm or less) as the bonding functional intermediate layer produces optical attenuation as described in, for example, Japanese Laid Open Patent Application No. P2004-337927A. Such optical attenuation possibly deteriorates the performance and reliability of a device such as the optical MEMS device required to have optical transparency, and therefore this approach is not appropriate as a device manufacture method. On the other hand, the room-temperature bonding method is a method for which the bonding property largely depends on physical properties of materials to be bonded, and it is impossible to realize both the bonding strength and the optical transmission characteristics simply by using another material for the bonding functional intermediate layer.

It is an object of the present invention to provide a device and device manufacture method which are capable of room-temperature bonding of a $SiO_2$ base material substrate with a practical bonding strength and excellent in optical transmission characteristics.

It is another object of the present invention to provide a device and a device manufacture method which are capable of preventing damage and lessening layout restrictions.

A device according to the present invention includes: a first substrate mainly containing silicon dioxide; a second substrate mainly containing silicon, compound semiconductor, silicon dioxide or fluoride; and a bonding functional intermediate layer arranged between the first substrate and the second substrate, and functioning to cause a practical bonding strength. The first substrate is bonded to the second substrate thorough room temperature bonding in which a sputtered first surface of the first substrate is contacted with a sputtered second surface of the second substrate via the bonding functional intermediate layer. At this time, the material of the bonding functional intermediate layer is selected from among optically transparent materials which are oxide, fluoride, or nitride, the materials being different from the main component of the first substrate and different from the main component of the second substrate. Such a device allows ensuring a practical bonding strength for bonding the first substrate to the second substrate, ensuring excellent optical transmission through the bonding interface, and arranging the bonding interface in a region transmitted by light. Therefore, such a device can relax restrictions on the layout related to the bonding interface, make the layout diversified, and make manufacturing process more diversified.

In the device according to the present invention, it is preferable that the first substrate is made of one of quartz, fused quartz, and glass each having a crystal structure. The device according to the present invention is characterized in that the second substrate is made of one of the quartz, the fused quartz, and the glass. The quartz has a crystal structure.

Examples of preferred material of the bonding functional intermediate layer include aluminum oxide, titanium dioxide, zirconium dioxide, and hafnium dioxide. In the device according to the present invention, the bonding functional intermediate layer is distributed in a layered fashion on the interface between first and second materials. In addition, another device according to the present invention is characterized in that a bonding functional intermediate layer is distributed in a continuous or an intermittent thin film fashion on the interface between first and second materials.

A device according to the present invention includes: a first substrate having optical transparency, and mainly containing silicon dioxide; and a second substrate on which a photo detector is formed which generates an output signal or an electromotive force in response to external light. The first and second substrates are bonded through room temperature bonding with a bonding functional intermediate layer having optical transparency to seal the photo detector. Here, the first substrate is preferably made of one of quartz and fused quartz each having a crystal structure. Preferred examples of the photo detector include a CCD and a CMOS sensor. Other examples of the photo detector include a solar cell, a photoelectric conversion device, and a functional device converting electromagnetic wave (such as high frequency electromagnetic wave) into electric power.

A device according to the present invention includes: a first substrate having optical transparency, and mainly containing silicon dioxide; and a second substrate on which a light-emitting device is formed. The first and second substrates are bonded through room temperature bonding with a bonding functional intermediate layer having optical transparency to seal the light-emitting device. Here, preferred examples of a material of the bonding functional intermediate layer include aluminum oxide, titanium dioxide, zirconium dioxide, and hafnium dioxide.

A device according to the present invention is an optical signal transmission device transmitting an optical signal, and includes: a first substrate having optical transparency, and mainly containing silicon dioxide; and a second substrate having optical transparency, and mainly containing silicon dioxide. The first and second substrates are bonded through room temperature bonding with a bonding functional intermediate layer having optical transparency. The optical signal transmits through the interface between the first and second substrates. Here, preferred examples of a material of the bonding functional intermediate layer include aluminum oxide and titanium dioxide. Examples of such an optical signal transmission device include an optical switch, a lens, and an optical fiber. Other examples of such an optical signal transmission device include a photonic crystal fiber.

A device manufacture method according to the present invention is a method of manufacturing a device excellent in optical transmission by bonding SiO$_2$ base material substrates with a practical bonding strength through room temperature bonding. The device manufacture method according to the present invention includes steps of: sputtering a surface of a first substrate mainly containing silicon dioxide; attaching a bonding functional intermediate layer functioning to cause a practical bonding strength in room temperature bonding onto the surface; and preparing a bonded substrate by bonding the first substrate to a second substrate mainly containing one of silicon, compound semiconductor, silicon dioxide, and fluoride through the room temperature bonding in which the sputtered surface of the first substrate is contacted with a surface of the second substrate via the bonding functional intermediate layer. Here, the material of the bonding functional intermediate layer is selected from among optically transparent materials which are oxide, fluoride, or nitride, the materials being different from the main component of the first substrate, and different from the main component of the second substrate. Further, a device manufacture method according to the present invention includes steps of: sputtering a surface of a first substrate mainly containing silicon dioxide; sputtering a surface of a second substrate mainly containing one of silicon, compound semiconductor, silicon dioxide, and fluoride; attaching a bonding functional intermediate layer functioning to cause a practical bonding strength in room temperature bonding onto the surface; and preparing a bonded substrate by bonding the surface of the first substrate to the surface of the second substrate by the room temperature bonding with a bonding functional intermediate layer. At this time, the material of the bonding functional intermediate layer is selected from among optically transparent materials which are oxide, fluoride, or nitride, the materials being different from the main component of the first substrate, and different from the main component of the second substrate. The device manufacture method according to the present invention further includes a step of sputtering the surface of the second substrate simultaneously with sputtering of the surface of the first substrate.

A device manufacture method according to the present invention includes steps of: forming a bonding functional intermediate layer on a surface of a first substrate mainly containing silicon dioxide; sputtering the surface of the first substrate after forming the bonding functional intermediate layer; and preparing a bonded substrate by bonding the first substrate to a second substrate mainly containing one of silicon, compound semiconductor, silicon dioxide, and fluoride through room temperature bonding with the bonding functional intermediate layer. Another device manufacture method according to the present invention includes steps of: forming a bonding functional intermediate layer on a surface of a first substrate mainly containing silicon dioxide; sputtering the surface of the first substrate on which surface the bonding functional intermediate layer is formed; sputtering a surface of a second substrate mainly containing one of silicon, compound semiconductor, silicon dioxide, and fluoride; and preparing a bonded substrate by bonding the surface of the first substrate to the second substrate through room temperature bonding with the bonding functional intermediate layer. The device manufacture method according to the present invention further includes a step of sputtering the surface of the second substrate simultaneously with sputtering of the surface of the first substrate.

In the above-described device manufacture method, material of the bonding functional intermediate layer is selected from among optically transparent materials which are oxide, fluoride, and nitride, the materials being different from a main component of the first substrate, and different from a main component of the second substrate. The device manufacture method according to the present invention is characterized in that the first substrate is made of one of quartz, fused quartz, and glass each having a crystal structure. The device manufacture method according to the present invention is further characterized in that the second substrate is made of one of quartz, fused quartz, and glass each having a crystal structure.

Examples of preferred material of the bonding functional intermediate layer include aluminum oxide, titanium dioxide, zirconium dioxide, and hafnium dioxide. In addition, the bonding functional intermediate layer is distributed in a layered fashion on the interface between the first substrate and the second substrate. Further, in another device according to the present invention, the bonding functional intermediate layer is distributed in a continuous or an intermittent thin film fashion on the interface between first and second substrates.

BEST MODE FOR CARRYING OUT THE INVENTION

Figure 1:
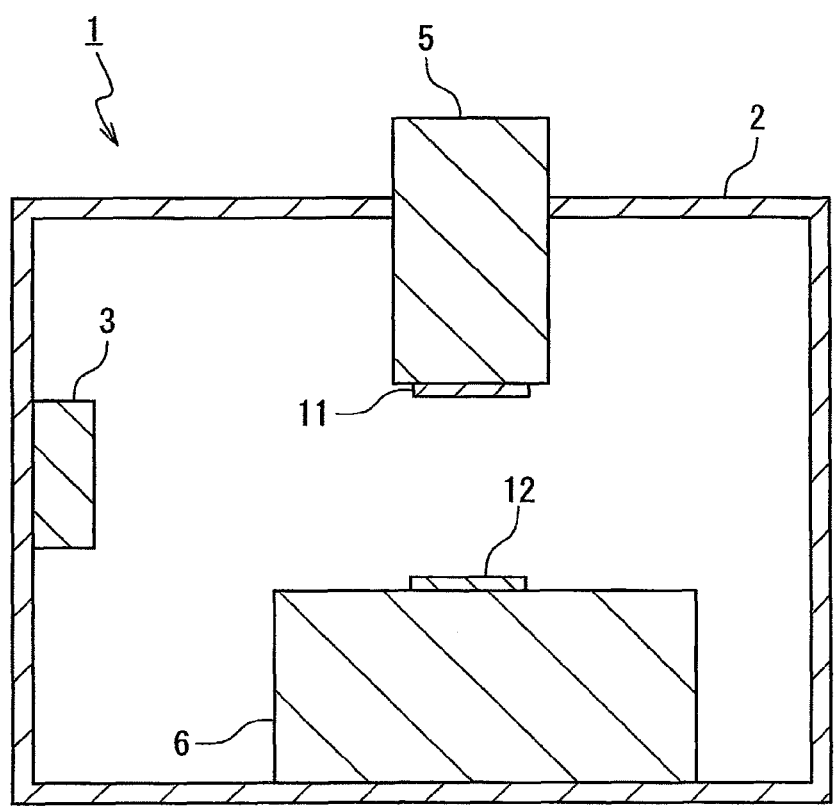
FIG. 1 is a cross-sectional view showing a room-temperature bonding apparatus in an embodiment of the present invention.

Embodiments of a device according to the present invention will be described with reference to the drawings. The device is manufactured using a room-temperature bonding apparatus. The room-temperature bonding apparatus 1 includes a bonding chamber 2, an ion gun 3, an upper stage 5, and a lower stage 6 as shown in FIG. 1.

The bonding chamber 2 is a container having the interior sealed from the environment and made of stainless steel. The bonding chamber 2 also includes a vacuum pump and a cover which are not shown. The vacuum pump evacuates gas from the interior of the bonding chamber 2. Examples of the vacuum pump include a turbo molecular pump evacuating the gas by causing a plurality of internal metal blades to flick away molecules of the gas. The cover closes or opens a gate connecting the exterior to the interior of the bonding chamber 2.

The upper stage 5 is made of stainless steel, formed into a cylindrical shape, and supported to allow a parallel shift in the vertical direction with respect to the bonding chamber 2. The upper stage 5 includes a dielectric layer provided on the lower end of the cylindrical shape, applies a voltage between the dielectric layer and a substrate 11, and attracts the substrate 11 to the dielectric layer by the electrostatic force to thereby support the substrate 11. The upper stage 5 also includes a pressure application mechanism that is not shown. In accordance with user's operations, the pressure application mechanism achieves parallel shift of the upper stage 5 in the vertical direction with respect to the bonding chamber 2.

The lower stage 6 is made of stainless steel. The lower stage 6 includes a dielectric layer provided on the upper end of the lower stage 6, applies a voltage between the dielectric layer and a substrate 12, and attracts the substrate 12 to the dielectric layer by an electrostatic force to thereby support the substrate 12. The lower stage 6 also includes a positioning mechanism that is not shown. In accordance with user's operations, the positioning mechanism achieves a parallel shift of the lower stage 6 in a parallel direction to the horizontal direction and moves to rotate about a rotational axis in parallel to the vertical direction.

The ion gun 3 is directed to the substrate 11 supported by the upper stage 5 and the substrate 12 supported by the lower stage 6. The ion gun 3 emits charged particles accelerated in the direction where the ion gun 3 is directed. Examples of the charged particles include argon ions. The bonding chamber 2 may further include an electron gun that is not shown. The electron gun is arranged to be directed to the target irradiated with the charged particles by the ion gun 3, and emits electrons accelerated in the direction toward the target. Such electrons are used to neutralize the target positively charged with the charged particles emitted from the ion gun 3.

A device manufacture method in an embodiment of the present invention is a method of manufacturing the device according to the present invention, which is implemented by using the room-temperature bonding apparatus 1. FIGS. 2 to 5 show states of the substrates 11 and 12 in performing room-temperature bonding of the substrates 11 and 12 by using the room-temperature bonding apparatus 1. First, the operator opens the cover of the bonding chamber 2, attaches holds the substrate 11 on the upper stage 5, and attaches the substrate 12 on the lower stage 6. The operator closes the cover of the bonding chamber 2 and generates a vacuum atmosphere within the bonding chamber 2. The operator manipulates the positioning mechanism of the lower stage 6 to move the lower stage 6 horizontally so that the substrate 11 is opposed to the substrate 12.

Figure 2:
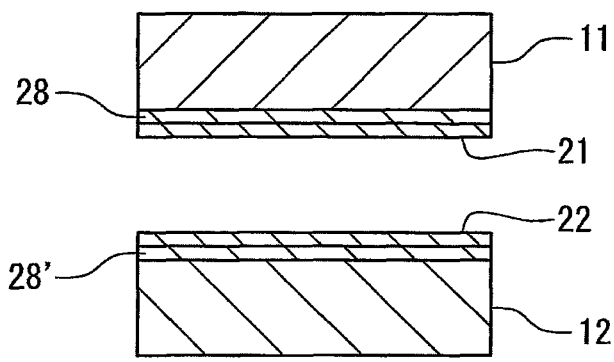
FIG. 2 is a cross-sectional view showing states of substrates.

The substrate 11 is made of fused quartz, and has a bonding functional intermediate layer 28 formed on the surface of the substrate 11 as shown in FIG. 2. The bonding functional intermediate layer 28 is formed of aluminum oxide and has an optical transparency. The bonding functional intermediate layer 28 functions to achieve a practical bonding strength. An inert surface 21 is present on the surface of the bonding functional intermediate layer 28. The inert surface 21 is formed of a material outermost layer or the like in a state in which the bonds are terminated with impurities adhering onto the inert surface 21, products metamorphosed from the substrate material, oxygen and the like to cause an insufficient reaction activity. The substrate 12 is made of fused quartz similarly to the substrate 11, and a bonding functional intermediate layer 28' is formed on the surface of the substrate 12. The bonding functional intermediate layer 28' is made of aluminum oxide and has an optical transparency. The bonding functional intermediate layer 28' functions to cause a practical bonding strength. An inert surface 22 is formed on the surface of the bonding functional intermediate layer 28' similarly to the bonding functional intermediate layer 28. The inert surface 22 is formed of a material outermost layer or the like in a state in which the bonds are terminated with impurities adhering onto the inert surface 22, products metamorphosed from a substrate material, oxygen and the like, to cause an insufficient reaction activity.

Figure 3:
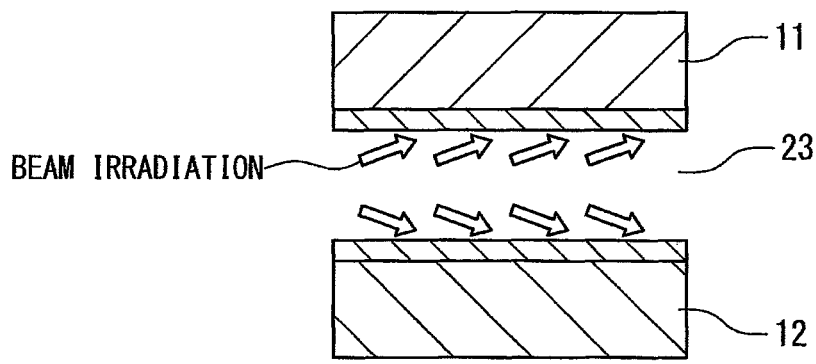
FIG. 3 is a cross-sectional view showing other states of the substrates.

As shown in FIG. 3, the operator irradiates the space between the substrates 12 and 11 with the charged particles using the ion gun 3 in a state in which the substrates 11 and 12 are sufficiently away from each other. At this time, the substrates 12 and 11 are sputtered by being irradiated with the charged particles, and the inert surfaces 21 and 22 formed on the surfaces of the respective substrates 12 and 11 are removed.

Figure 4:
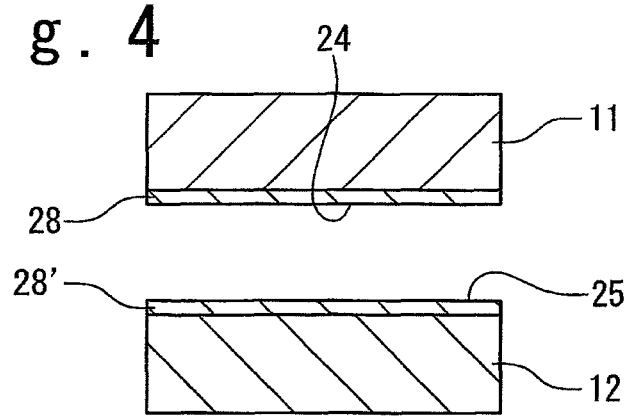
FIG. 4 is a cross-sectional view showing still other states of the substrates.
Figure 5:
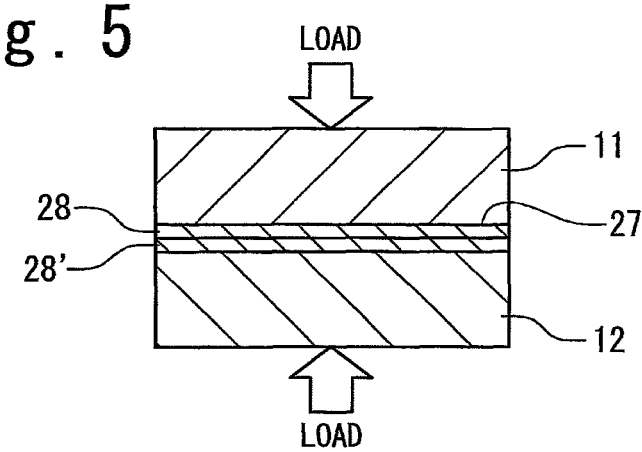
FIG. 5 is a cross-sectional view showing still other states of the substrates.

After the irradiation with the charged particles completes, active surfaces 24 and 25 are exposed on the surfaces of the bonding functional intermediate layers 28 and 28' of the substrates 11 and 12, as shown in FIG. 4, respectively.

The operator manipulates the pressure application mechanism of the upper stage 5 to move the upper stage 5 down in the vertical direction, thereby contacting the active surface 24 of the substrate 11 with the active surface 25 of the substrate 12. The substrates 11 and 12 are bonded to each other through room temperature bonding by so contacting the substrate 11 with the substrate 12. At this time, the bonding functional intermediate layers 28 and 28' are present on the interface 27 between the substrates 11 and 12 and cause a practical bonding strength between the substrates 11 and 12 to mediate between bonding of the substrate 11 to the substrate 12.

Alternatively, the bonding functional intermediate layers 28 and 28' may be distributed to the interface 27 in the form of intermittent thin films. Such bonding functional intermediate layers 28 and 28' can cause a practical bonding strength between the substrates 11 and 12 to mediate between bonding of the substrate 11 to the substrate 12.

The bonding functional intermediate layers 28 and 28' may be formed of a substance other than aluminum oxide. The substance is made of material which has optical transparency and is any of oxide, nitride, and fluoride. Examples of the oxide include titanium dioxide $TiO_2$, zirconium dioxide $ZrO_2$, and hafnium dioxide $HfO_2$. Examples of the nitride include silicon nitride SiN and titanium nitride TiN. Examples of the fluoride include calcium fluoride $CaF_2$ and magnesium fluoride $MgF_2$. The bonding functional intermediate layer 28 is formed of one or more substances out of these substances.

The bonding functional intermediate layer 28 may be formed on the substrate 11 at a timing different from the timing before sputtering the substrates 11 and 12. For example, when the substrate 11 is sputtered while the constituent material of the bonding functional intermediate layer 28 is discharged into the bonding chamber 2, then the inert surface 21 formed on the surface of the bonding functional intermediate layer 28 on the substrate 11 is removed, and the discharged material is deposited on the substrate 11 to form the bonding functional intermediate layer 28.

With the above-stated device manufacture method, the substrates 11 and 12, which are made of the $SiO_2$ base material and difficult to achieve room temperature bonding to each other with the conventional methods, are bonded through room temperature bonding by interposing the bonding functional intermediate layers 28 and 28' as a product.

It should be noted that the substrates 11 and 12 may be made of material other than fused quartz. Examples of other materials include synthetics quartz and glass, such as Pyrex (registered trademark). Glass such as Pyrex (registered trademark) and fused quartz are solidified without being crystallized and have a three-dimensional net structure. With the room temperature bonding method according to the present invention, even if the two substrates to be bonded through room temperature, bonding are made of any of such $SiO_2$ base materials, the substrates can be used as the substrates 11 and 12 similarly to the substrates 11 and 12 made of fused quartz and can be bonded through room temperature bonding with a practical bonding strength.

Furthermore, when a product produced by such a device manufacture method is a product in which the substrates 11 and 12 are made of $SiO_2$ base material having optical transparency, an optical loss resulting from reduction in the signal intensity and light absorption is avoided since the interface 27 does not absorb light (such as high intensity laser beam) when the produce is irradiated with light. This allows manufacturing a device which fails to hamper the transmission of an optical signal or exhibits superior durability against high intensity light. Also, a product which is produced with such a device manufacture method does not have an electric conduction property in the bonding interface due to the use of material which is one of oxide, fluoride, and nitride for bonding of the $SiO_2$ base materials, and therefore the interface does not hamper the transmission of electromagnetic wave. This property can be effectively applied to, for example, manufacturing of an RF-MEMS device which receives light transmitted through the substrates and in which functional devices receive the electromagnetic wave and convert the received electromagnetic wave into power driving the devices.

It should be noted that, as for the product manufactured with such a device manufacture method, the compositions of the bonding functional intermediate layers provided on the interface of the two room-temperature-bonded substrates can be measured. Example of a measurement method includes EDX analysis using a transmission electron microscope.

Figure 6:
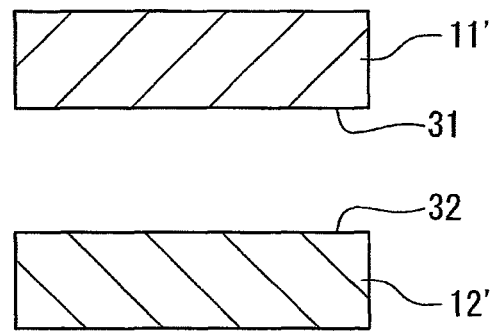
FIG. 6 is a cross-sectional view showing states of substrates in a comparative example.
Figure 7:
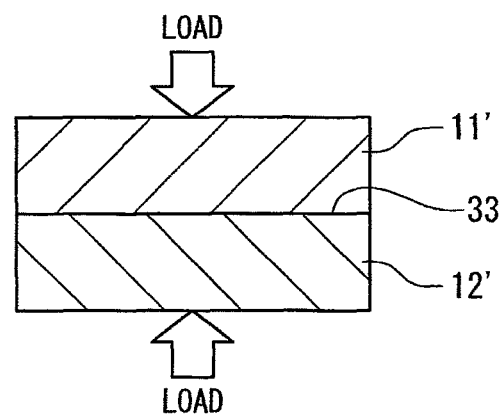
FIG. 7 is a cross-sectional view showing other states of the substrates in the comparative example.

As shown in FIG. 6, a device manufacture method according to a comparative example to the present invention is implemented with substrates 11' and 12' from which bonding functional intermediate layers 28 and 28' are excluded, respectively. With the device manufacture method according to the comparative example, active surfaces 31 and 32 are exposed on the surfaces of the substrates 11' and 12', respectively, after irradiation of charged particles completes. The active surface 31 mainly contains $SiO_2$, which is same as the basic material of the substrate 11'. The active surface 32 is made of the same component as the basic material of the substrate 12'. As shown in FIG. 7, the substrates 11' and 12' are bonded through room temperature bonding by contacting the active surface 31 of the substrate 11' with the active surface 32 of the substrate 12'. No other material which functions to cause bonding strength is interposed between the active surfaces 31 and 32, and therefore a practical bonding strength cannot be obtained even after a load is applied to achieve bonding with the both contacted with each other.

Figure 8:
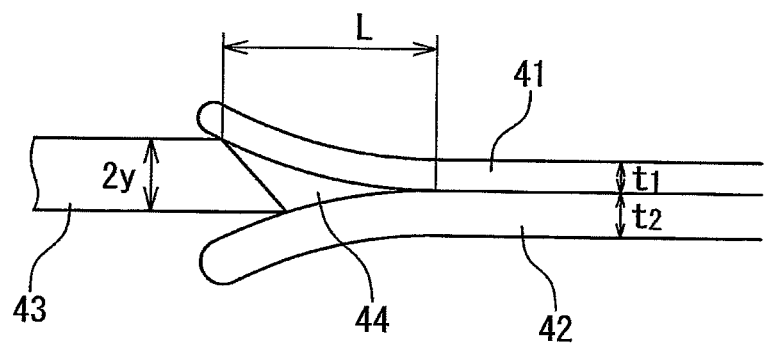
FIG. 8 is a cross-sectional view showing states of substrates when bonding strengths of the substrates are evaluated.

The bonding strength between the substrates bonded through room temperature bonding can be evaluated using the bond energy of the bonding region. The bond energy can be evaluated by a well-known method. Examples of the method include an edge insertion method described in Takagi, Mechanical Engineering Laboratory Report 189 (2000). FIG. 8 shows a method of measuring the bond energy using the edge insertion method. That is, the inspector inserts an edge of a razor 43 into the interface between substrates 41 and 42. At this time, the substrates 41 and 42 separate from each other and a crack 44 is formed. The inspector measures the extension length of the crack 44. The bond energy $\Delta_\gamma$ per unit area of one surface of the bonding interface is expressed by the following equation:

$$\Delta \gamma = \frac{3}{4} \frac{E_1 E_2 t_1^3 t_2^3}{(E_1 t_1^3 + E_2 t_2^3)} \frac{y^2}{L^4},$$

wherein the extension length of the crack 44 is L, the thickness of the razor edge 43 is 2y, the thickness of the substrate 41 is $t_1$, the thickness of the substrate 42 is $t_2$, the Young's modulus of the substrate 41 is $E_1$, and the Young's modulus of the substrate 42 is $E_2$. The bond energy $\Delta_\gamma$ indicates that the bonding strength is higher and it is more difficult to separate the substrates from each other if the value of the bond energy $\Delta_\gamma$ is higher.

Moreover, if the bond energy $\Delta_\gamma$ is equal to or higher than 0.1 $J/m^2$, this implies, for example, that the substrates 41 and 42 are bonded to the extent that the substrates 41 and 42 are not separated from each other when the substrates 41 and 42 are subjected to gentle dicing, although the substrates 41 and 42 are bonded with a low bonding strength. If the bond energy $\Delta_\gamma$ is equal to or higher than 0.5 $J/m^2$, this implies that the substrates 41 and 42 are bonded to the extent that the substrates 41 and 42 are not separated from each other when the substrates 41 and 42 are subjected to fast dicing. Based on this discussion, the "practical bonding strength" is defined as a strength if the bond energy $\Delta_\gamma$ per unit area of one surface on the bonding interface is equal to or higher than 0.1 $J/m^2$, preferably equal to or higher than 0.5 $J/m^2$.

The following table shows an experimental result of an experiment measuring the bond energy $\Delta_\gamma$ for the substrates bonded through room temperature bonding by using the device manufacture method according to the present invention.

| Bonding functional intermediate layer | Bond energy $\Delta_\gamma$ |
| --- | --- |
| None | 0.05 $J/m^2$ or less |
| Aluminum oxide $Al_2O_3$ | 0.5 $J/m^2$ or more |
| Titanium dioxide $TiO_2$ | 0.8 $J/m^2$ or more |
| Zirconium dioxide $ZrO_2$ | 0.8 $J/m^2$ or more |
| Hafnium dioxide $HfO_2$ | 0.8 $J/m^2$ or more |

Here, each bonding functional intermediate layer 28 is formed to have a thickness of several nanometers. That is, the experimental result indicates that the bond energy $\Delta_\gamma$ of the bonded part is lower than 0.1 $J/m^2$ when the bonding functional intermediate layer 28 is not arranged, the bond energy $\Delta_\gamma$ is equal to or higher than 0.5 $J/m^2$ when the bonding functional intermediate layer 28 is made of aluminum oxide $Al_2O_3$, that the bond energy $\Delta_\gamma$ is equal to or higher than 0.8 $J/m^2$ when the bonding functional intermediate layer 28 is made of titanium dioxide $TiO_2$, that the bond energy $\Delta_\gamma$ is equal to or higher than 0.8 $J/m^2$ when the bonding functional intermediate layer 28 is made of zirconium dioxide $ZrO_2$, and that the bond energy $\Delta_\gamma$ is equal to or higher than 0.8 $J/m^2$ when the bonding functional intermediate layer 28 is made of hafnium dioxide $HfO_2$. That is, this experimental result indicates that the bond energy $\Delta_\gamma$ of the bonded part of the substrates bonded through room temperature bonding is lower than 0.1 $J/m^2$ when the bonding functional intermediate layer 28 is not prepared, and that the bond energy $\Delta_\gamma$ of the bonded part of the substrates bonded through room temperature bonding is equal to or higher than 0.1 $J/m^2$ when the bonding functional intermediate layer 28 is prepared. This experimental result also indicates that the substrates are not bonded to each other with a practical bonding strength when the bonding functional intermediate layer 28 is not prepared, and that the substrates are bonded to each other with a practical bonding strength when the bonding functional intermediate layer 28 is arranged.

Figure 9:
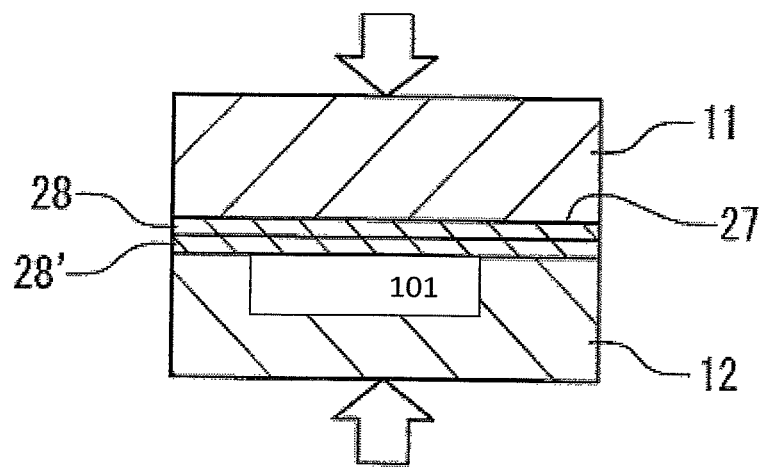
FIG. 9 is a cross-sectional view showing a photo detector main body formed on a substrate.

A device in an embodiment of the present invention is produced with the above-stated room temperature bonding method using the above-stated room temperature bonding apparatus 1. As shown in FIG. 9, the device is applied to a photo detector generating an electric signal or an electromotive force based on received light, and includes a plurality of substrates and a photo detector main body 101. The plurality of substrates include substrates 11 and 12: a substrate on which the photo detector main body is formed, and a $SiO_2$ base material substrate mainly containing $SiO_2$ and transmitting light, which is excellent in the optical transparency. Examples of $SiO_2$ base material include synthetic quartz, Pyrex (registered trademark), glass, and fused quartz each having a crystal structure. The Pyrex (registered trademark), the glass, and the fused quartz are solidified without being crystallized and have a stereoscopic net structure. The photo detector main body 101 generates the electric signal or electromotive force based on the light with which the device is irradiated.

Formed in the plurality of substrates are interfaces bonded through room temperature bonding by using the device manufacture method according to the present invention. That is, the bonding functional intermediate layer 28 is formed on the interface 27 between the substrates 11 and 12. The bonding functional intermediate layer 28 is made of one of oxide, nitride, and fluoride each having optical transparency. Examples of the oxide include aluminum oxide $Al_2O_3$, titanium dioxide $TiO_2$, zirconium dioxide $ZrO_2$, and hafnium dioxide $HfO_2$. Examples of the nitride include silicon nitride SiN and titanium nitride TiN. Examples of the fluoride include calcium fluoride $CaF_2$ and magnesium fluoride $MgF_2$. The photo detector main body 101 is formed on one of the plurality of substrates (for example, the substrate 12), and sealed from the environment by the plurality of substrates (for example, the substrates 11 and 12). The photo detector main body 101 generates an electric signal or electromotive force based on light transmitted through the interface 27 between the substrates 11 and 12.

Such a device is configured so that the $SiO_2$ base materials, which are difficult to bond to each other with the conventional room temperature bonding, are bonded through room temperature bonding with the bonding functional intermediate layer 28, is free from deterioration of performance and reliability and excellent in light transmission of transmitting light to the photo detector. Furthermore, the bonding interface between the substrates 11 and 12 allows transmitting light and such a device allows arranging the bonding interface in a region transmitting light. Accordingly, such a device can lessen restrictions on layout related to the bonding interface, make the layout diversified, and make the manufacturing process more diversified. As a result, the device can further facilitate designing and further facilitate the manufacturing process.

Figure 10:
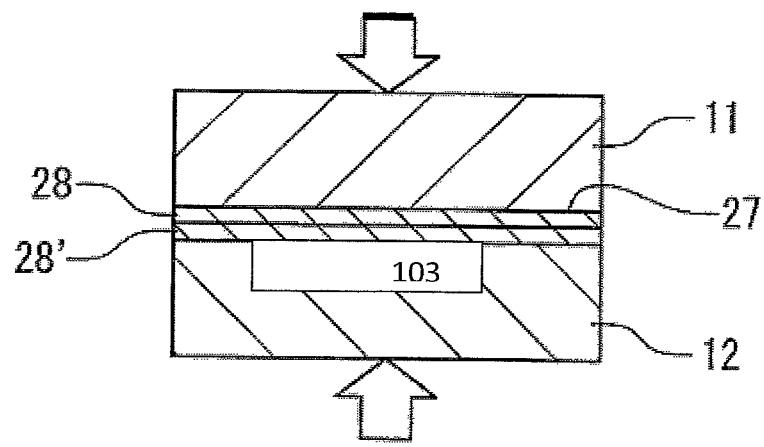
FIG. 10 is a cross-sectional view showing a light-emitting device formed on a substrate.

It should be noted that the device according to the present invention is also applicable to, as shown in FIG. 10, a light-emitting device emitting light based on an applied electric signal. In this case, the device includes a plurality of substrates and a light-emitting device main body. The plurality of substrates includes the substrates 11 and 12 and an interface bonded through room temperature bonding is formed inside. That is, the bonding functional intermediate layer 28 is formed on the interface 27 between the substrates 11 and 12. The bonding functional intermediate layer 28 is made of one of oxide, nitride, and fluoride having optical transparency. Examples of the oxide include aluminum oxide $Al_2O_3$, titanium dioxide $TiO_2$, zirconium dioxide $ZrO_2$, and hafnium dioxide $HfO_2$. Examples of the nitride include silicon nitride SiN and titanium nitride TiN. Examples of the fluoride include calcium fluoride $CaF_2$ and magnesium fluoride $MgF_2$. The light-emitting device main body 103 is formed on one of the plurality of substrates (for example, the substrate 12), and sealed from the environment by the plurality of substrates (for example, the substrates 11 and 12). The light-emitting device main body 103 emits light based on an electrical signal applied to the device. The light is transmitted through the interface 27 between the substrates 11 and 12 and emitted to outside.

Such a device is configured so that the $SiO_2$ base materials, which are difficult to bond to each other with the conventional room temperature bonding, are bonded through room temperature bonding, and is free from deterioration of performance and reliability and excellent in optical transmission of transmitting light from the light-emitting device. The device allows arranging the bonding interface between the substrates 11 and 12 in a region transmitting light. Therefore, such a device can lessen restrictions on layout related to the bonding interface, make the layout diversified, and make the manufacturing process more diversified. As a result, the device can further facilitate designing and further facilitate the manufacturing process.

Figure 11:
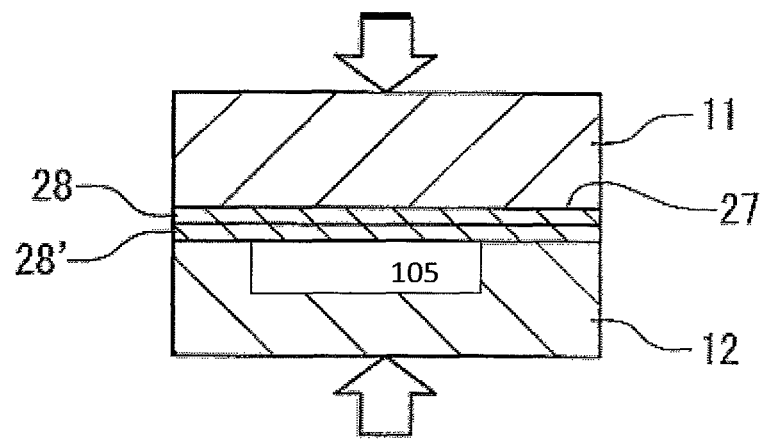
FIG. 11 is a cross-sectional view showing an optical signal transmission device formed on a substrate.

Moreover, the device according to the present invention is applicable to, as shown in FIG. 11, an optical signal transmission device. In this case, the device includes a plurality of substrates and an optical signal transmission device main body. The plurality of substrates includes the substrates 11 and 12 and an interface bonded through room temperature bonding is formed inside. That is, the bonding functional intermediate layer 28 is formed on the interface 27 between the substrates 11 and 12. The bonding functional intermediate layer 28 is made of one of oxide, nitride, and fluoride having optical transparency. Examples of the oxide include aluminum oxide $Al_2O_3$, titanium dioxide $TiO_2$, zirconium dioxide $ZrO_2$, and hafnium dioxide $HfO_2$. Examples of the nitride include silicon nitride SiN and titanium nitride TiN. Examples of the fluoride include calcium fluoride $CaF_2$ and magnesium fluoride $MgF_2$. The optical signal transmission device main body 105 is formed on one of the plurality of substrates (for example, the substrate 12), and sealed from the environment by the plurality of substrates (for example, the substrates 11 and 12). Examples of the optical signal transmission device main body 105 include an optical switch, a lens, and an optical fiber. The optical switch includes a mirror and a plurality of light transmission paths. The optical switch reflects an inputted optical signal on the mirror, and outputs the reflected optical signal to one optical transmission path selected from among the plurality of optical transmission paths. Examples of such an optical signal transmission device main body 105 also include a photonic crystal fiber. The optical signal is transmitted by the interface 27 between the substrates 11 and 12 and emitted to outside.

Similarly to the above-stated devices, such a device is configured so that the $SiO_2$ base materials, which are difficult to bond to each other with the conventional room-temperature bonding, are room-temperature-bonded to each other via the bonding functional intermediate layer 28, and is free from deterioration of performance and reliability. The device is free from attenuation resulting from a strain caused by a heat treatment or absorption by the intermediate layer, and excellent in the transmission performance for the optical signal transmitted via the interface and in the durability against high intensity light. Further, the device allows arranging the bonding interface between the substrates 11 and 12 in a region transmitting light. Therefore, such a device can lessen restrictions on layout related to the bonding interface, make the layout diversified, and make the manufacturing process more diversified. As a result, the device can further facilitate designing and further facilitate the manufacturing process.

The device according to the present invention is formed so that the $SiO_2$ base materials, which are difficult to bond to each other with the conventional room-temperature bonding, are bonded through room temperature bonding, is free from deterioration of performance and reliability, and is excellent in the optical transmission characteristics. With the device manufacture method according to the present invention, the $SiO_2$ base materials, which are difficult to bond to each other with the conventional room-temperature bonding, are bonded through room temperature bonding with a practical bonding strength, and room temperature bonding can be achieved without causing deterioration of optical transmission on the bonding interface, thereby allowing manufacturing a device free from deterioration of performance and reliability, and excellent in the optical transmission characteristics.

The invention claimed is:

1. A device manufacture method, comprising:
    sputtering a first surface of a first substrate mainly containing silicon dioxide; and
    preparing a bonded substrate by room-temperature bonding in which said first surface is contacted in a vacuum atmosphere with a second surface of a second substrate mainly containing silicon, compound semiconductor, silicon dioxide, or fluoride via a bonding functional intermediate layer to thereby bond said first substrate to said second substrate,
    wherein material of said bonding functional intermediate layer is selected from among optically transparent materials which are oxide, fluoride, or nitride, the material being different from the main component of the first substrate, and different from the main component of the second substrate.

2. The device manufacture method according to claim 1, wherein said first surface is subject to sputtering after said bonding functional intermediate layer is formed thereon.

3. The device manufacture method according to claim 2, further comprising:
    sputtering said second surface simultaneously with the sputtering of said first surface.

4. The device manufacture method according to claim 3, wherein said first substrate is fused quartz, glass or quartz having a crystal structure.

5. The device manufacture method according to claim 2, wherein said first substrate is fused quartz or quartz having a crystal structure.

6. The device manufacture method according to any one of claim 1, wherein said first substrate is fused quartz, glass or quartz having a crystal structure.

7. The device manufacture method according to claim 6, wherein said second substrate is fused quartz, glass or quartz having a crystal structure.

8. A device manufacture method, comprising:
    sputtering a first surface of a first substrate mainly containing silicon dioxide: and
    preparing a bonded substrate by contacting said first surface with a second surface of a second substrate mainly containing silicon, compound semiconductor, silicon dioxide, or fluoride via a bonding functional intermediate layer to thereby bond said first substrate to said second substrate.
    wherein material of said bonding functional intermediate layer is selected from among optically transparent materials which are oxide, fluoride, or nitride, the materials being different from the main component of the first substrate, and different from the main component of the second substrate,
    wherein said first substrate is fused quartz, glass or quartz having a crystal structure,
    wherein said second substrate is fused quartz, glass or quartz having a crystal structure,
    wherein material of said bonding functional intermediate layer is aluminum oxide, titanium dioxide, zirconium dioxide, or hafnium dioxide.

9. A device manufacture method, comprising:
    sputtering a first surface of a first bonding functional intermediate layer formed on a first substrate mainly containing silicon dioxide;
    sputtering a second surface of a second bonding functional intermediate layer formed on a second substrate mainly containing silicon, compound semiconductor, silicon dioxide, or fluoride;
    preparing a bonded substrate by room-temperature bonding in which said first surface of said first bonding functional intermediate layer is contacted in a vacuum atmosphere with a second surface of said second to thereby bond said first substrate to said second substrate,
    wherein material of said first sand second bonding functional intermediate layers is selected from among optically transparent materials which are oxide, fluoride, or nitride, the materials being different from the main component of the first substrate, and different from the main component of the second substrate.

10. The device manufacture method according to claim 9, wherein the sputtering of said second surface is performed simultaneously with the sputtering of said first surface.

* * * * *